(12) United States Patent
Nakamura et al.

(10) Patent No.: US 10,937,758 B2
(45) Date of Patent: Mar. 2, 2021

(54) SEMICONDUCTOR-DEVICE MANUFACTURING METHOD AND MANUFACTURING APPARATUS

(71) Applicants: SHINKAWA LTD., Tokyo (JP); TOHOKU UNIVERSITY

(72) Inventors: Tomonori Nakamura, Tokyo (JP); Takehito Shimatsu, Miyagi (JP); Miyuki Uomoto, Miyagi (JP)

(73) Assignees: SHINKAWA LTD., Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/482,246

(22) PCT Filed: Jan. 30, 2018

(86) PCT No.: PCT/JP2018/002968
§ 371 (c)(1),
(2) Date: Jul. 30, 2019

(87) PCT Pub. No.: WO2018/143196
PCT Pub. Date: Aug. 9, 2018

(65) Prior Publication Data
US 2020/0006282 A1    Jan. 2, 2020

(30) Foreign Application Priority Data
Jan. 31, 2017    (JP) .............................. JP2017-015745

(51) Int. Cl.
*H01L 21/00*    (2006.01)
*H01L 23/00*    (2006.01)
*H01L 21/66*    (2006.01)

(52) U.S. Cl.
CPC .............. *H01L 24/81* (2013.01); *H01L 22/12* (2013.01); *H01L 24/75* (2013.01); *H01L 24/95* (2013.01)

(58) Field of Classification Search
CPC ......... H01L 24/81; H01L 22/12; H01L 24/75; H01L 24/95; H01L 2223/54426;
(Continued)

(56) References Cited

U.S. PATENT DOCUMENTS

| 5,753,536 A | 5/1998 | Sugiyama et al. |
| 5,904,545 A * | 5/1999 | Smith .................... G02F 1/1362 216/108 |
| 7,198,978 B2 * | 4/2007 | Onozawa ................ H01L 24/95 257/E21.705 |

FOREIGN PATENT DOCUMENTS

| CN | 105826215 | 8/2016 |
| JP | 08-125121 | 5/1996 |

(Continued)

OTHER PUBLICATIONS

"Office Action of Taiwan Counterpart Application," with English translation thereof, dated Sep. 10, 2018, p. 1-p. 11.
(Continued)

*Primary Examiner* — Vu A Vu
(74) *Attorney, Agent, or Firm* — JCIPRNET (57) ABSTRACT

Provided is a bonding method for directly bonding an electrode part of a chip component to a bonding part provided on a substrate that is a bonding target, the method comprising: a step for placing the substrate on a stage inside a liquid vessel; a step for injecting liquid into the liquid vessel; and a step for bonding the electrode part of the chip component to the bonding part (electrode part) of the bonding target by superimposing the chip component held by a bonding head in the liquid stored in the liquid vessel over the bonding target and then applying pressure thereto.

11 Claims, 3 Drawing Sheets

(58) Field of Classification Search
CPC . H01L 2223/54486; H01L 2223/54473; H01L 23/544; H01L 2224/0913; H01L 2224/0613; H01L 2224/05554; H01L 24/06; H01L 24/09; H01L 2224/08225; H01L 24/08; H01L 2224/05644; H01L 2224/05647; H01L 2224/759; H01L 2224/75753; H01L 2224/8013; H01L 2224/80132; H01L 2224/7501; H01L 2224/80085; H01L 2224/75101; H01L 2224/80894; H01L 24/80; H01L 2924/14; H01L 24/05
USPC .......................................................... 438/14
See application file for complete search history.

(56) References Cited

FOREIGN PATENT DOCUMENTS

| | | |
|---|---|---|
| JP | 09-074116 | 3/1997 |
| JP | 2005-260173 | 9/2005 |

OTHER PUBLICATIONS

"International Search Report (Form PCT/ISA/210)" of PCT/JP2018/002968, dated Mar. 27, 2018, with English translation thereof, pp. 1-4.

\* cited by examiner

SEMICONDUCTOR-DEVICE MANUFACTURING METHOD AND MANUFACTURING APPARATUS

CROSS-REFERENCE TO RELATED APPLICATION

This application is a 371 application of the International PCT application serial no. PCT/JP2018/002968, filed on Jan. 30, 2018, which claims priority benefits of Japan Patent Application No. 2017-015745 filed on Jan. 31, 2017. The entirety of each of the abovementioned patent applications is hereby incorporated by reference herein and made a part of this specification.

TECHNICAL FIELD

The present application discloses a semiconductor device manufacturing method and a manufacturing apparatus, in which each electrode part of a chip component is directly bonded to a bonding part provided on a bonding target.

BACKGROUND

In recent years, miniaturization and weight reduction have been required in electronic devices, and further improvement in mounting density of semiconductor devices is required. Flip chip bonding is known as a method for mounting a chip component configuring a semiconductor device on a bonding target such as a substrate. The flip chip bonding includes forming a protrusion, which is referred to as a bump, on the chip component, and electrically connecting an electrode part of the chip component and a bonding part (e.g., an electrode part) of the bonding target via the bump.

At the present time, aiming at further densification of substrates, miniaturization of such bumps is also required. However, since there is a limit in miniaturizing bumps, a bumpless method characterized by elimination of bumps is proposed in some cases. For example, PTL 1 discloses a bonding method for directly bonding a chip component and a bonding target at their electrode parts, according to the law of metal-to-metal bonding, by mutually stacking and pressurizing the chip component and the bonding target that are positioned in a predetermined relationship. According to this bonding method, it is not necessary to form any bump on the chip component and accordingly electrode parts can be arranged densely.

CITATION LIST

Patent Literature

PTL 1: JP 2005-260173 A

SUMMARY

Technical Problem

However, according to the technology of PTL 1, to prevent oxidation of electrode parts, a bonding head and a stage on which a substrate is placed are accommodated in a chamber, and the inside of the chamber is made a vacuum or filled with inert gas. Such accommodation of the bonding head and the stage in the chamber leads to increase in size and complexity of the entire apparatus. In addition, making the inside of the chamber a vacuum or filling with inert gas is necessary prior to the bonding, which makes a mounting process complicated. Further, in the case of direct bonding, since there is no bump that absorbs variation in parallelism between the chip component and the bonding target (substrate or the like), even very small particles may deteriorate the bonding accuracy. Therefore, in the case of direct bonding, sufficiently cleaning surfaces of the electrode part of the chip component and the bonding part (electrode part) of the bonding target is necessary prior to the bonding, which is very laborious.

Therefore, the present application discloses a semiconductor device manufacturing method and a manufacturing apparatus that can directly bond the chip component to the bonding target with a simpler procedure and configuration.

Solution to Problem

A semiconductor device manufacturing method disclosed in the present application is for directly bonding an electrode part of a chip component to a bonding part provided on a bonding target. The semiconductor device manufacturing method includes a placement step of placing the bonding target in a liquid vessel, a liquid injection step of injecting liquid into the liquid vessel, and a step of bonding the electrode part to the bonding part by stacking the chip component held by a bonding head on the bonding target in the liquid stored in the liquid vessel.

According to this method, since the chip component and the bonding target are disposed in the liquid, foreign substances can be easily and effectively removed. As a result, the chip component can be directly bonded to the bonding target in a simpler procedure.

The above-mentioned manufacturing method may further include a position detection step of detecting the position of the bonding target after the placement step and before the liquid injection step, and a positioning step of mutually positioning the bonding target and the bonding head based on a position detection result in the position detection step.

According to this method, the detection of positions is not affected by the liquid, and therefore more accurate positioning can be performed and the bonding accuracy can be improved.

Further, the liquid may be an etching solution for etching a bonding surface of the electrode part or a bonding surface of the bonding part to generate an active layer on the bonding surface of the electrode part or the bonding surface of the bonding part, and the step of bonding may be bonding any one bonding surface, on which the active layer has been generated, to the other bonding surface. In this case, the electrode part or the bonding part may have a metal thin film serving as the bonding surface, and the etching solution may etch the metal thin film to generate the bonding surface.

According to this method, surfactant bonding can be performed more easily because the electrode part and the bonding part can be activated when disposed in the liquid, without processing for activating them in advance.

Further, the electrode part or the bonding part may have a metal thin film serving as a bonding surface, and the step of bonding may be bonding the electrode part and the bonding part via the thin film. In this case, the liquid may be selected from the group consisting of ultrapure water, fluorine inert fluid, and silicone oil or a group consisting of liquid mixtures thereof.

According to this method, atomic diffusion bonding can be performed more easily.

Further, the electrode part may be made of a copper thin film, and the liquid may contain an ion adjustment agent for preventing oxidation of the electrode part.

According to this configuration, oxidation of the electrode part and the bonding part can be effectively prevented, and the electrode part can be directly bonded more suitably.

A semiconductor device manufacturing apparatus disclosed in the present application is for directly bonding each electrode part of a chip component to a bonding part provided on a bonding target. The semiconductor device manufacturing apparatus includes a liquid vessel for storing liquid, with an inner space in which the bonding target is placed, and a bonding head for directly bonding the electrode part of the chip component to the bonding part of the bonding target by stacking the chip component and the bonding target together in the liquid stored in the liquid vessel.

According to this configuration, the chip component and the bonding target are disposed in the liquid. Therefore, foreign substances can be easily and effectively removed. As a result, the chip component can be directly bonded to the bonding target with a simpler configuration.

The above-mentioned manufacturing apparatus may further include an injection and discharge mechanism for injecting and discharging liquid to and from the liquid vessel, a position detection mechanism for detecting the position of the bonding target placed in the liquid vessel, in a state where no liquid is injected in the liquid vessel, and a positioning mechanism for mutually positioning the bonding target and the bonding head held in the liquid vessel based on a position detection result by the position detection mechanism. The injection and discharge mechanism may inject the liquid into the liquid vessel after the position detection by the position detection mechanism.

According to this configuration, the detection of positions is not affected by the liquid, and therefore more accurate positioning can be performed and the bonding accuracy can be improved.

Further, the above-mentioned manufacturing apparatus may include a head liquid removal mechanism for removing liquid adhered to the bonding head when the bonding head is pulled up from the liquid in the liquid vessel.

According to this configuration, when picking up a new chip component with the bonding head, it is possible to prevent the liquid from adhering to the bonding head.

Further, the above-mentioned manufacturing apparatus may include an ultrasonic cleaning mechanism for propagating ultrasonic vibrations to the liquid in the liquid vessel.

According to this configuration, the bonding target and the chip component disposed in the liquid can be effectively cleaned by ultrasonic vibrations.

Advantageous Effects of Invention

According to the semiconductor device manufacturing method and the manufacturing apparatus disclosed in the present application, since the chip component and the bonding target are disposed in the liquid, foreign substances can be easily and effectively removed. As a result, the chip component can be directly bonded to the bonding target with a simpler procedure and configuration.

DESCRIPTION OF EMBODIMENTS

Figure 1:
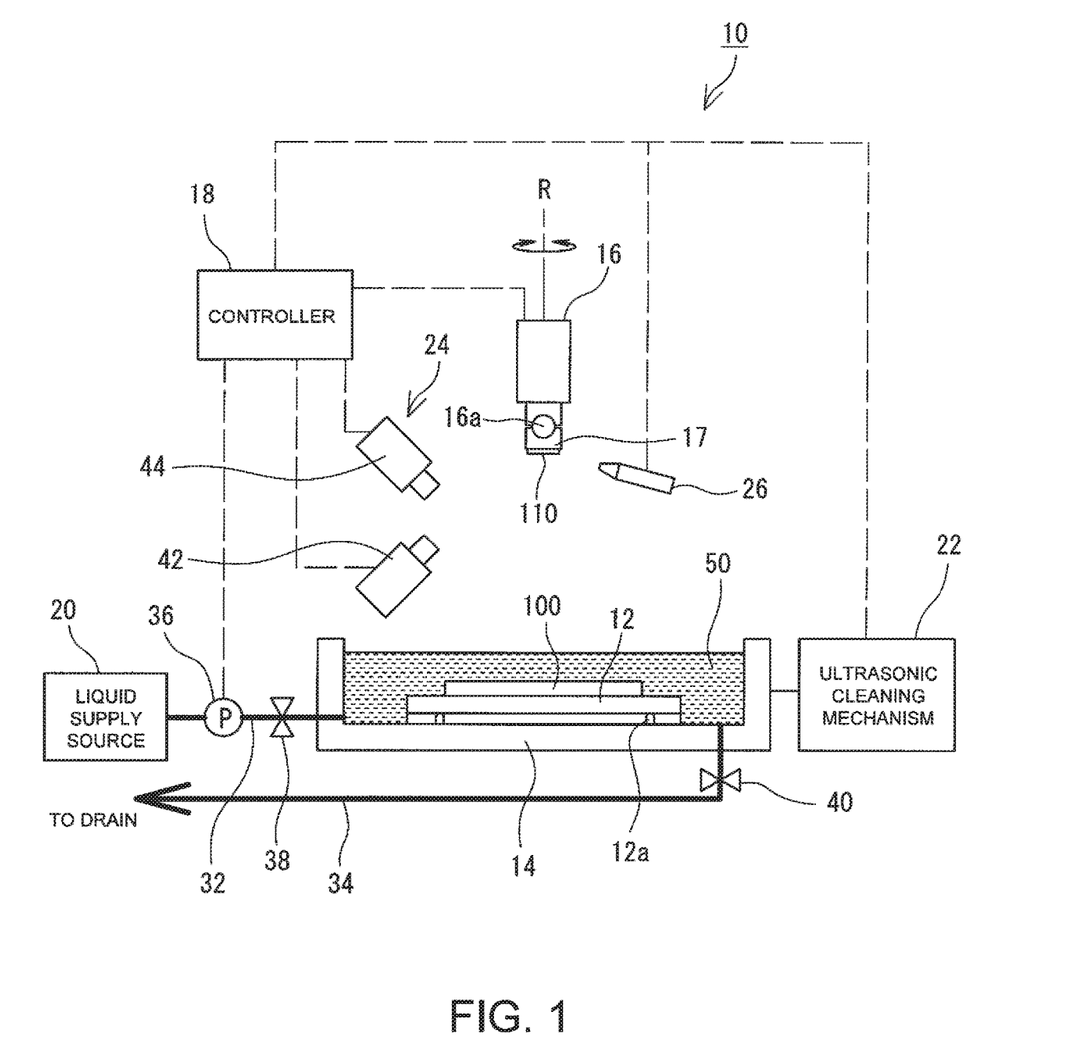
FIG. 1 A diagram illustrating the configuration of a semiconductor device manufacturing apparatus.

Hereinafter, a semiconductor device manufacturing apparatus 10 will be described with reference to attached drawings. FIG. 1 is a diagram illustrating the configuration of the semiconductor device manufacturing apparatus 10. The manufacturing apparatus 10 is an apparatus particularly suitable for directly bonding a chip component 110 to a substrate 100 that is a bonding target.

Here, the direct bonding is causing electrode parts 112 formed on the chip component 110 and electrode parts 102 (bonding parts) formed on the bonding target (the substrate 100 or the like) to be brought into contact with each other and directly bonded, without any intervention of intermediary members, such as bumps, adhesive, wire, and the like. Typical direct bonding includes atomic diffusion bonding and surfactant bonding. Both the atomic diffusion bonding and the surfactant bonding are bonding methods for stacking bonding members (the electrode parts 102 and 112) and bonding them together under the temperature condition lower than the melting points thereof so as not to cause plastic deformation. The atomic diffusion bonding is a bonding method characterized by using the diffusion of metal atoms occurring between bonding surfaces when causing metal thin films to be brought into contact with each other and bonded. The surfactant bonding is a bonding method characterized by surface-treating bonding surfaces, before bonding, so as to bring superficial atoms of the bonding surfaces into an active state for chemical bonding. In the following description, exemplary bonding using the atomic diffusion bonding will be described. However, the technology disclosed in the present application can be applied not only to atomic diffusion bonding but also to surfactant bonding or a bonding technique using any other direct bonding.

Figure 2:
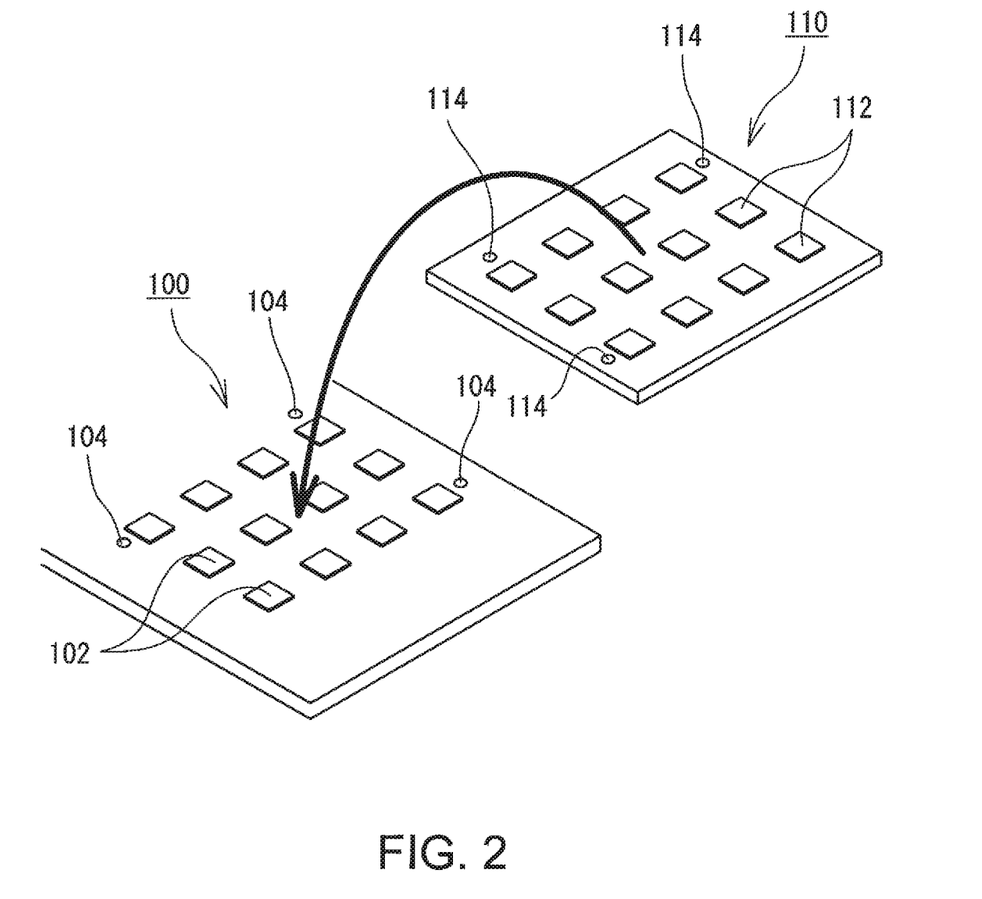
FIG. 2 A schematic perspective view illustrating a chip component and a substrate.
Figure 3:
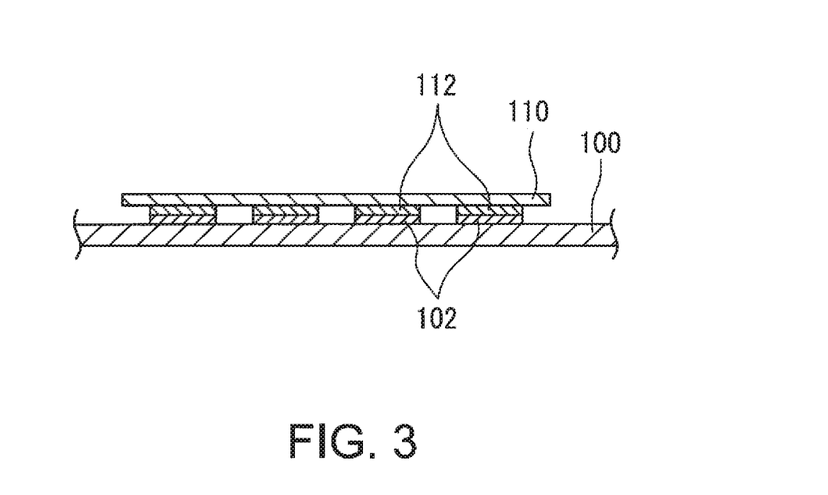
FIG. 3 A schematic cross-sectional view illustrating the chip component and the substrate that are directly bonded.

Prior to the description of the manufacturing apparatus 10, configurations of the chip component 110 and the substrate 100 (i.e., the bonding target) will be described with reference to FIGS. 2 and 3. FIG. 2 is a schematic perspective view illustrating the chip component 110 and the substrate 100. FIG. 3 is a schematic cross-sectional view illustrating a state where the chip component 110 is bonded to the substrate 100.

The chip component 110 is an IC separated from a wafer through a scribing process and formed into a chip shape. On a bonding surface of the chip component 110, one or more (12 in the illustrated example) electrode parts 112 are densely formed in a predetermined pattern. The electrode part 112 contains conductive metal, such as gold or copper. In the drawings, for the sake of easy viewing, respective electrode parts 112 are illustrated as if they are thick. However, the illustration does not reflect actual thicknesses and the electrode parts 112 are thin enough to enable the atomic diffusion bonding. Specifically, the electrode part 112 is provided with a metal thin film having a thickness of several nm to several hundred nm. Such electrode parts 112 can be formed, for example, by sputtering or the like. The bonding surface is further provided with one or more (three in the illustrated example) positioning marks 114. Here, as will be apparent from the foregoing description, the chip component 110 is a bumpless chip having no bumps.

Similarly, one or more (12 in the illustrated example) electrode parts 102 are formed on the substrate 100. The electrode parts 102 function as bonding parts to which the electrode parts 112 of the chip component 110 can be bonded. Like the electrode parts 112 of the chip component 110, the electrode parts 102 of the substrate 100 are metal thin films containing conductive metal, such as gold or copper, and can be formed by sputtering or the like. Further, the substrate 100 is also provided with one or more (three in the illustrated example) positioning marks 104. In FIGS. 2 and 3, although the electrode parts 102 protrude from an upper surface of the substrate 100, the electrode parts 102 may be embedded in the substrate 100 such that their upper surfaces are exposed to the outside and are continuous with the upper surface of the substrate 100 (without any protrusion of the electrode parts 102).

When bonding the chip component 110 onto the substrate 100, the chip component 110 is positioned relative to the substrate 100 so that the positioning marks 114 of the chip component 110 exactly coincide with the positioning marks 104 of the substrate 100, and then the chip component 110 is placed on top of the substrate 100. Subsequently, when the electrode parts 112 of the chip component 110 are pressed against the electrode parts 102 of the substrate 100 with an appropriate load, the electrode parts 112 and 102 are bonded together due to a diffusion phenomenon of metal atoms constituting respective electrode parts 112 and 102.

Next, the manufacturing apparatus 10 will be described with reference to FIG. 1. The manufacturing apparatus 10 includes a stage 12, a liquid vessel 14, a bonding head 16, a controller 18, and the like. The substrate 100 is placed on the stage 12. The stage 12 is provided with a substrate holding mechanism (not illustrated) that holds the substrate 100 to prevent the placed substrate 100 from moving. For example, a sucking mechanism for sucking and holding the substrate 100 from a bottom side thereof, a clamping mechanism for pressing and fixing the substrate 100 onto the stage 12 with a claw member, or the like can be used as the substrate holding mechanism.

In addition, the stage 12 includes a built-in substrate parallelism adjustment mechanism 12a for adjusting the parallelism of the substrate 100 placed and held on the stage 12. The substrate parallelism adjustment mechanism 12a is a mechanism for adjusting the inclination of an upper surface of the stage 12 to horizontally adjust the substrate 100 placed on the stage 12. The substrate parallelism adjustment mechanism 12a may be, for example, a spherical bearing mechanism in which a convex hemispherical member and a concave hemispherical member are combined, or may be a lifting mechanism or the like for raising or lowering the stage 12 at three predetermined points independently.

As described below, liquid 50 is injected into the liquid vessel 14 in which the stage 12 is accommodated, so that the periphery of the stage 12 is filled with the liquid 50. Accordingly, it is desirable that each of the substrate holding mechanism and the substrate parallelism adjustment mechanism 12a is configured to operate without causing any problem when it is in contact with the liquid 50, or has a configuration capable of preventing the mechanism from contacting the liquid 50.

The stage 12 is accommodated and fixed in the liquid vessel 14. The liquid vessel 14 is a container in which the liquid 50 can be stored. The liquid vessel 14 is not particularly limited in shape and size if it is large enough for immersion of the stage 12 and the substrate 100 placed on the stage 12 in the liquid. The liquid vessel 14 is connected to an injection pipe 32 for injecting the liquid 50 into the liquid vessel 14 and a discharge pipe 34 for discharging the liquid 50 stored in the liquid vessel 14 to the outside. The injection pipe 32 connects the liquid vessel 14 to a liquid supply source 20. Provided midway along the injection pipe 32 are an injection pump 36 for delivering the liquid 50 and an injection valve 38. Both the injection pump 36 and the injection valve 38 are driven and controlled by the controller 18. Driving the injection pump 36 in a state where the injection valve 38 is opened can inject the liquid 50 into the liquid vessel 14. The injection pipe 32 is not particularly limited in connection point if it is connected to the liquid vessel 14. However, when prevention of bubble generation is taken into consideration, it is desirable that the injection pipe 32 is connected to the liquid vessel 14 in the vicinity of a bottom surface thereof.

The discharge pipe 34 connects the liquid vessel 14 to a drain, and a discharge valve 40 is provided midway along the discharge pipe 34. The discharge valve 40 is driven and controlled by the controller 18. Opening the discharge valve 40 can discharge the liquid 50. It is desirable that the discharge pipe 34 is connected to the bottom surface of the liquid vessel 14. In addition, the discharge pipe 34 may have not only a drainage route extending to the drain but also a recirculation route returning to the injection pipe 32. Switching the discharge destination of the liquid 50 between the drainage route and the recirculation route may also be desirable. In the case of providing the recirculation route, it is desirable to provide a filter for removing foreign substances from the circulating liquid 50. Providing the recirculation route can circulate the liquid 50 supplied to the liquid vessel 14 and can cause the liquid 50 to flow appropriately. Thus, foreign substances can be prevented from staying in the liquid vessel 14, and direct bonding of the chip component 110 can be performed appropriately.

The liquid 50 to be supplied to the liquid vessel 14 is not particularly limited if it does not hinder the direct bonding, especially, atomic diffusion bonding. Here, as described below, in the case of direct bonding, a very small amount of foreign substances (particles) may cause a problem. Therefore, the liquid 50 must be high in the level of removal of foreign substances. Accordingly, for example, ultrapure water whose electric resistivity is 15 MΩ·cm or more can be used as the liquid 50. In the case of using ultrapure water, an ultrapure water manufacturing apparatus can be used as the liquid supply source 20. Further, the ultrapure water may be replaced by chemically inactive liquid, such as fluorine inert fluid, silicone oil, or the like. That is, the liquid can be selected from the group consisting of ultrapure water, fluorine inert fluid, and silicone oil or the group consisting of fluid mixtures thereof. In addition, the liquid 50 may contain an ion adjustment agent that prevents superficial oxidation of the electrode parts 102 and 112. For example, sulfate ions or the like can be used as the ion adjustment agent.

In the case of performing surfactant bonding instead of atomic diffusion bonding, the liquid 50 may be an etching solution that generates active layers on the bonding surfaces of the electrode parts 102 of the substrate 100 or the electrode parts 112 of the chip component 110. Such an etching solution may contain an ion adjustment agent added to prevent oxidation.

The bonding head 16 is provided above the liquid vessel 14. The bonding head 16 holds the chip component 110 and bonds the chip component 110 on the substrate 100 while pressing it. A chip holding mechanism (not illustrated) for holding the chip component 110 is provided at a tip end 17 of the bonding head 16. The chip holding mechanism may be a sucking mechanism for sucking and holding the chip component 110 from a back surface thereof or a gripping mechanism for gripping the chip component 110 with a pair of arms. Here, since the tip end 17 of the bonding head 16 is also immersed in the liquid 50, it is desirable that the chip holding mechanism is configured to operate without causing any problem when it is in contact with the liquid 50, or has a configuration capable of preventing the mechanism from contacting the liquid 50.

The bonding head 16 can move up and down, move horizontally, and rotate around a vertical axis R. In addition, the bonding head 16 is provided with a chip parallelism adjustment mechanism 16a, so that the inclination of a tip end surface thereof can be adjusted with respect to a horizontal surface. The chip parallelism adjustment mechanism 16a is a mechanism for adjusting the inclination of the tip end surface of the bonding head 16 to horizontally adjust the chip component 110 held on the tip end surface. A spherical bearing mechanism or the like in which a convex hemispherical member and a concave hemispherical member are combined can be used as the chip parallelism adjustment mechanism 16a.

A position detection mechanism 24 for detecting the positions of the chip component 110 and the substrate 100 is provided in the vicinity of the liquid vessel 14 and the bonding head 16. The position detection mechanism 24 is not particularly limited if it can detect the position and attitude of each of the chip component 110 and the substrate 100. The position detection mechanism 24 is, for example, a contactless distance measuring sensor for contactless detection of the distance from an object, a camera configured to acquire image data by imaging an object, or the like, which can be used alone or can be configured in combination.

According to the example illustrated in FIG. 1, the position detection mechanism 24 includes a chip camera 42 that images the chip component 110 held by the bonding head 16 and a substrate camera 44 that images the substrate 100 held on the stage 12. Image data obtained when imaging with respective cameras 42 and 44 is sent to the controller 18. The controller 18 calculates the position and attitude based the received image data for each of the chip component 110 and the substrate 100. Various known image processing techniques can be used in calculation of the position and attitude. For example, a pattern patching technique may be used to detect the positioning marks 104 and 114 based on the image data of the chip component 110 and the substrate 100, and detect the position and attitude of each of the chip component 110 and the substrate 100 based on distortion, rotation amount, size, or the like of the positioning marks 104 and 114. Further, a stereo measurement method, a triangulation method, or the like may be used, as another method, to detect the position and attitude of each of the chip component 110 and the substrate 100. Each of the chip camera 42 and the substrate camera 44 may be a single device or can be configured as a plurality of devices.

Here, as described repeatedly, the liquid 50 is injected into the liquid vessel 14 that accommodates the stage 12. In the state where the liquid 50 is injected, detecting the position and attitude with the cameras 42 and 44 or the distance measuring sensor is difficult. Therefore, the position detection mechanism 24 detects the position and attitude of the substrate 100 in a state before the liquid 50 is injected into the liquid vessel 14.

Further, a liquid removal mechanism 26 for removing the liquid 50 from the tip end of the bonding head 16 is provided above the liquid vessel 14. That is, as described below, the tip end 17 of the bonding head 16 advances into the liquid 50 stored in the liquid vessel 14 in the process of bonding. After advancement into the liquid 50, droplets adhere to the tip end 17 of the bonding head 16 when the bonding head 16 is pulled up. The liquid removal mechanism 26 removes the droplets adhered to the tip end 17. The liquid removal mechanism 26 is not limited in configuration if the liquid 50 adhered to the tip end 17 can be removed. According to the example illustrated in FIG. 1, the liquid removal mechanism 26 is a blower mechanism that jets a gas to the tip end 17 to blow off the liquid 50. The manufacturing apparatus 10 further includes an ultrasonic cleaning mechanism 22 that removes foreign substances from the electrode parts 102 and 112 of the substrate 100 and the chip component 110 by applying ultrasonic vibrations to the liquid 50 in the liquid vessel 14.

The controller 18 is for controlling the entire driving of the manufacturing apparatus 10, and includes a CPU that performs various calculations and a storage unit that stores various parameters and programs. Although the controller 18 is illustrated as a single unit in FIG. 1, the controller 18 may be configured as a combination of a plurality of control units (a plurality of CPUs and a plurality of storage units). In this case, the plurality of control units is connected by wire or wirelessly. In addition, some of the plurality of control units may be disposed at a remote place far from the liquid vessel 14 or the like.

As is apparent from the above descriptions, the manufacturing apparatus 10 disclosed in the present application directly bonds the chip component 110 to the substrate 100 in the liquid 50. The reason for performing the direct bonding in liquid will be described in comparison with the conventional art.

In the conventional art in which the bonding is performed with bumps, slight variations in the height of the chip component 110 and the substrate 100 have been absorbed with bumps. Therefore, even if minute foreign substances are present between the chip component 110 and the substrate 100, no problem occurs in many cases. However, in the case of direct bonding, no bump is formed on the chip component 110. The electrode parts 112 of the chip component 110 and the electrode parts 102 of the substrate 100 are directly bonded. In this case, even if foreign substances adhered to the electrode parts 112 of the chip component 110 and the electrode parts 102 of the substrate 100 are very minute, the bonding accuracy is greatly deteriorated.

In order to avoid such problems, PTL 1 discloses cleaning the surfaces of the electrode parts 112 of the chip component 110 and the electrode parts 102 of the substrate 100 and then directly bonding the chip component 110 and the substrate 100 while holding them in a vacuum or in an inert gas atmosphere. Specifically, a chamber (a clean room) capable of maintaining the vacuum or the inert gas atmosphere is provided, and the bonding head 16 and the stage 12 are disposed in the chamber. However, such accommodation of the bonding head 16 and the stage 12 in the chamber leads to enlargement in size and complexity of the entire apparatus. Also, it is necessary to make the inside of the chamber a vacuum or fill with an inert gas prior to the bonding, which makes the mounting process complicated. Further, it is necessary to sufficiently clean the surfaces of the electrode parts of the chip component 110 and the bonding target prior to the bonding, which is very laborious.

In contrast, the manufacturing apparatus 10 disclosed in the present application is such that the substrate 100 is disposed in the liquid 50 and the chip component 110 is bonded to the substrate 100 in the liquid 50. In this case, since it is not necessary to maintain the periphery of the bonding head 16 or the like in a vacuum or an inert gas atmosphere, a chamber for accommodating them is unnecessary. As a result, the manufacturing apparatus 10 can be miniaturized and simplified.

In the case of bonding in the high-purity liquid 50, the substrate 100 and the chip component 110 are cleaned with the high-purity liquid 50 and foreign substances adhered to the electrode parts 102 and 112 of the substrate 100 and the chip component 110 are efficiently removed. As a result, the cleaning of the substrate 100 and the chip component 110 prior to the bonding is unnecessary and the process can be simplified. Further, the bonding in the liquid 50 can easily realize a state free from any factors that hinder the bonding, such as oxygen. In other words, in creating a deoxidation environment it is not necessary to use a great amount of expensive inert gas or form a vacuum environment, and accordingly the environment suitable for the bonding can be realized easily at low cost. Further, adjusting the components of the liquid 50 can suppress the oxidation of the electrode parts 102 and 112, and the direct bonding of the electrode parts 102 and 112 can be performed more appropriately.

Figure 4:
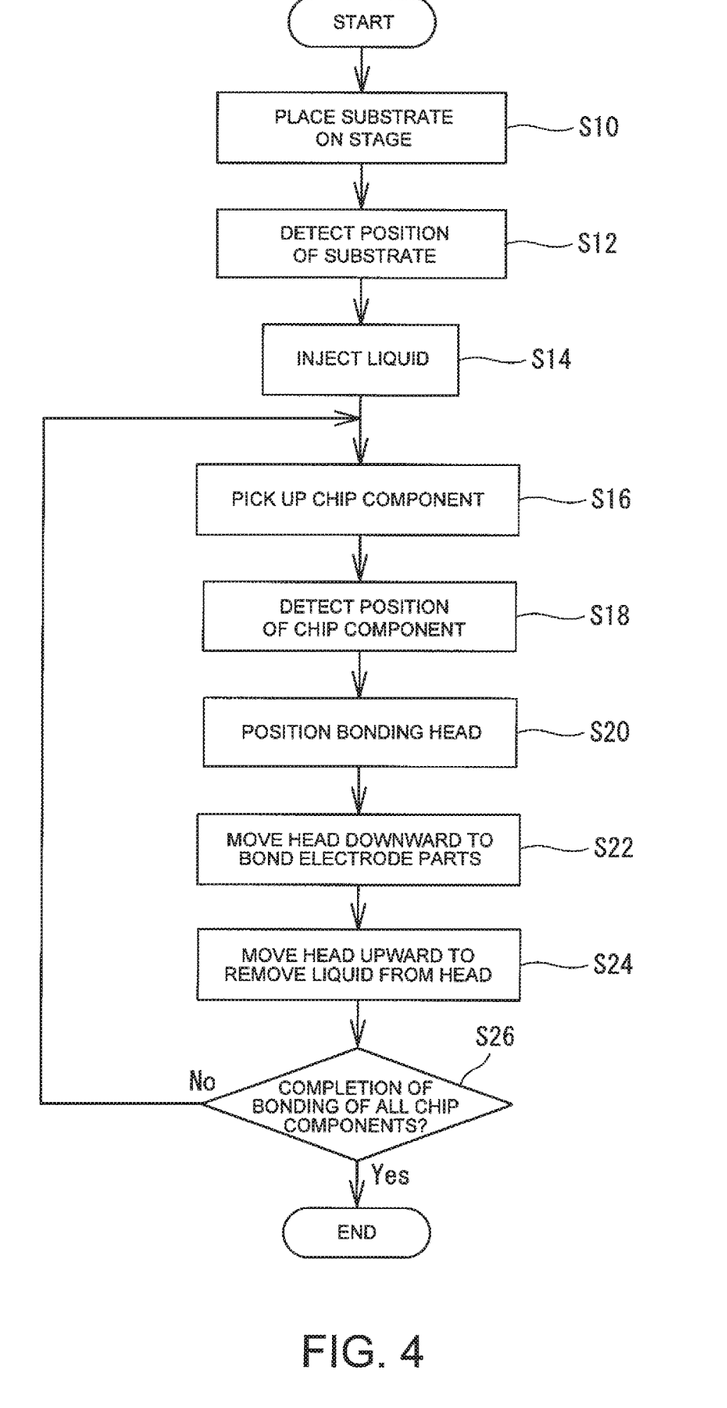
FIG. 4 A flowchart illustrating a flow of manufacturing a semiconductor device.

Next, a flow of manufacturing a semiconductor device by the manufacturing apparatus 10 will be described with reference to FIG. 4. FIG. 4 is a flowchart illustrating the flow in the manufacturing of a semiconductor device. When bonding the chip component 110 to the substrate 100 for manufacturing a semiconductor device, first, the substrate 100 is placed and set on the stage 12 in the liquid vessel 14 (S10). At this time, the liquid vessel 14 is in an empty state where the liquid 50 is not injected yet. The setting of the substrate 100 may be performed manually. Alternatively, various loading mechanisms may be used to automatically set the substrate 100.

After the placement of the substrate 100, the controller 18 drives the position detection mechanism 24 to detect the position and attitude of the substrate 100 (S12). Specifically, the substrate 100 is imaged with the substrate camera 44. The controller 18 performs image analysis on the obtained image data and calculates the position and attitude of the substrate 100. The substrate 100 is provided with the plurality of positioning marks 104 and the plurality of electrode parts 102. The controller 18 calculates the positions and attitudes of the plurality of positioning marks 104 and the plurality of electrode parts 102 and temporarily stores the calculated results. At this time, if it is determined that the substrate 100 is not horizontal, the substrate parallelism adjustment mechanism 12a is driven to adjust the substrate 100 horizontally.

If the position or the like of the substrate 100 is detected, then the controller 18 injects the liquid 50 into the liquid vessel 14 (S14). That is, the controller 18 opens the injection valve 38 and closes the discharge valve 40. Further, the controller 18 drives the injection pump 36 to deliver the liquid 50 from the liquid supply source 20 to the liquid vessel 14. At the time the liquid 50 reaches a prescribed water level, the controller 18 stops the injection of the liquid 50. Alternatively, when the liquid 50 has reached the prescribed water level, the injection may be continued without being stopped and the discharge valve 40 may be opened to perform injection and discharge of the liquid 50 in parallel for a predetermined period. As a result, a constant flow is generated in the liquid vessel 14, and the removal of foreign substances adhered to the substrate 100 is promoted. In addition, the ultrasonic cleaning mechanism 22 may be driven at this time so that ultrasonic vibrations can be applied to the substrate 100.

Subsequently, the bonding head 16 is driven to pick up the chip component 110 from a chip supply source (not illustrated) (S16). If the pickup of the chip component 110 is completed, then the controller 18 drives the position detection mechanism 24 to detect the position and attitude of the chip component 110 held by the bonding head 16 (S18). Specifically, image analysis is performed on the image data obtained by imaging with the chip camera 42 to calculate the position and attitude of the chip component 110. If the calculation of the position and attitude of the chip component 110 is completed, then the controller 18 performs positioning of the bonding head 16 so that the position and attitude of the chip component 110 with respect to the substrate 100 becomes appropriate (S20). Specifically, when the chip component 110 is not horizontal, the controller 18 drives the chip parallelism adjustment mechanism 16a to locate the chip component 110 horizontally. Further, the horizontal position of the bonding head 16 and the rotation amount of the bonding head 16 around the vertical axis R are adjusted so that the positioning marks 114 of the chip component 110 are positioned just above the corresponding positioning marks 104 of the substrate 100.

If the positioning of the chip component 110 with respect to the substrate 100 is completed, then the chip component 110 is bonded to the substrate 100 (S22). Specifically, the controller 18 lowers the bonding head 16 and presses the electrode parts 112 of the chip component 110 against the electrode parts 102 of the substrate 100 with an appropriate load. This causes atoms constituting the electrode parts 112 of the chip component 110 and the electrode parts 102 of the substrate 100 to diffuse, thereby bonding the electrode parts 112 and 102.

Prior to the bonding of the electrode parts 112 and 102, the lowering of the bonding head 16 may be temporarily stopped at the time the chip component 110 has advanced into the liquid 50, so that the chip component 110 is kept temporarily in a stationary state in the liquid 50. Leaving the chip component 110 stationary for a predetermined time in the liquid 50 can effectively remove foreign substances adhered to the chip component 110. In addition, when the chip component 110 is left stationary in the liquid 50, the injection and the discharge of the liquid 50 may be performed in parallel, and the ultrasonic cleaning mechanism may be driven to apply ultrasonic vibrations to the liquid 50. In any case, removing the foreign substances of the chip component 110 in advance can directly bond the substrate 100 and the chip component 110 more appropriately.

If the bonding of the electrode parts 112 of the chip component 110 and the electrode parts 102 of the substrate 100 is completed, then the controller 18 releases the holding of the chip component 110 by the bonding head 16 and lifts the bonding head 16 (S24). Further, when the bonding head 16 is raised to a predetermined height, the liquid removal mechanism 26 is driven to remove the liquid 50 adhered to the tip end 17 of the bonding head 16. Specifically, the blower is operated to blow off droplets adhered to the tip end 17.

If the bonding of one chip component 110 is completed, then the controller 18 confirms whether the bonding of all the chip components 110 is completed (S26). If there is a chip component 110 to be bonded to the substrate 100, similar processing is repeated after returning to step S16.

When the bonding of all the chip components 110 is completed, the bonding processing terminates. After termination of the bonding processing, the liquid 50 is discharged from the liquid vessel 14 and the substrate 100 is taken out from the stage 12.

As is apparent from the above description, according to the semiconductor device manufacturing apparatus 10 and the manufacturing method disclosed in the present application, the chip component 110 and the substrate 100 are disposed in the high-purity liquid 50 when directly bonded. Therefore, the foreign substances adhered to the electrode parts 112 of the chip component 110 and the electrode parts 102 of the substrate 100 can be efficiently removed, and the direct bonding can be appropriately performed. Further, arranging the chip component 110 and the substrate 100 in the high-purity liquid 50 can easily form an environment free from oxygen or the like that may hinder the direct bonding, and the manufacturing apparatus 10 can be miniaturized and simplified compared to the conventional art in which a chamber or the like is provided.

The configuration described here is an example, and therefore other configurations can be appropriately changed if the chip component 110 and the substrate 100 can be disposed in the high-purity liquid 50 when directly bonded. For example, in the above-mentioned example, the positioning of the chip component 110 with respect to the substrate 100 is performed by moving the bonding head 16. However, instead of or in addition to the bonding head 16, the liquid vessel 14 or the stage 12 can be moved to position the chip component 110 with respect to the substrate 100.

Further, in the above-mentioned example, the electrode parts 112 of the chip component 110 and the electrode parts 102 of the substrate 100 are bonded by atomic diffusion bonding, but any other direct bonding method, such as surfactant bonding, may be used for the bonding. In this case, the electrode parts 112 of the chip component 110 and the electrode parts 102 of the substrate 100 may be subjected to surface treatment so as to be activated prior to the bonding. In this case, as the liquid 50, a chemically inactive liquid 50 capable of maintaining the activated state may be selected. Further, as another type, the liquid 50 may be an etching solution that etches the bonding surfaces of the electrode parts 112 of the chip component 110 and the electrode parts 102 of the substrate 100 and generates active layers on the bonding surfaces. In this case, the chip component and the substrate 100 are not required to be activated in advance and may be immersed in the liquid 50 in the process of manufacturing. Further, in the above-mentioned example, the bonding head 16 is configured to have a surface with which the chip component 110 is pressed, but it may be configured to have a roller member or the like to press the chip component 110 successively from an edge. Further, the chip component 110 is not always required to be pressurized, and therefore the chip component 110 and the substrate 100 may be stacked without being pressurized if they can be directly bonded.

Further, although the above-mentioned example is such that the chip component 110 is bonded to the substrate 100, the bonding target to which the chip component 110 is bonded may be other than the substrate 100. For example, the chip component 110 bonded on the substrate 100 may be a bonding target. In other words, the technology disclosed in the present application may be applied in the case of bonding the chip component 110 onto another chip component 110. Although the liquid removal mechanism 26 and the ultrasonic cleaning mechanism 22 are provided in the above-mentioned example, these mechanisms may be omitted, as appropriate.

The invention claimed is:

1. A semiconductor device manufacturing method for directly bonding an electrode part of a chip component to a bonding part provided on a bonding target, comprising:
    a placement step of placing the bonding target in a liquid vessel;
    a liquid injection step of injecting liquid into the liquid vessel; and
    a step of bonding the electrode part to the bonding part by using a bonding head to press the chip component against the bonding target in the liquid stored in the liquid vessel.

2. The semiconductor device manufacturing method according to claim 1, further comprising:
    a position detection step of detecting the position of the bonding target after the placement step and before the liquid injection step; and
    a positioning step of mutually positioning the bonding target and the bonding head based on a position detection result in the position detection step.

3. The semiconductor device manufacturing method according to claim 1, wherein
    the liquid is an etching solution for etching a bonding surface of the electrode part and/or a bonding surface of the bonding part to generate an active layer on the bonding surface of the electrode part and/or the bonding surface of the bonding part, and
    the step of bonding is bonding any one bonding surface on which the active layer has been generated to the other bonding surface.

4. The semiconductor device manufacturing method according to claim 3, wherein
    the electrode part or the bonding part has a metal thin film serving as the bonding surface, and the etching solution etches the metal thin film to generate the active layer on the bonding surface.

5. The semiconductor device manufacturing method according to claim 1, wherein
    the electrode part or the bonding part has a metal thin film serving as a bonding surface, and
    the step of bonding is bonding the electrode part and the bonding part via the metal thin film.

6. The semiconductor device manufacturing method according to claim 1, wherein
    the liquid is selected from a group consisting of ultrapure water, fluorine inert fluid, and silicone oil, or a group consisting of liquid mixtures thereof.

7. The semiconductor device manufacturing method according to claim 1, wherein
    the electrode part is made of a copper thin film, and
    the liquid contains an ion adjustment agent for preventing oxidation of the electrode part.

8. A semiconductor device manufacturing apparatus for directly bonding each electrode part of a chip component to a bonding part provided on a bonding target, comprising:
    a liquid vessel for storing liquid, with an inner space in which the bonding target is placed; and
    a bonding head for directly bonding the electrode part of the chip component to the bonding part of the bonding target by pressing the chip component against the bonding target in the liquid stored in the liquid vessel.

9. The semiconductor device manufacturing apparatus according to claim 8, further comprising:

an injection and discharge mechanism for injecting and discharging the liquid to and from the liquid vessel;

a position detection mechanism for detecting the position of the bonding target placed in the liquid vessel, in a state where no liquid is injected in the liquid vessel; and a positioning mechanism for mutually positioning the bonding target and the bonding head held in the liquid vessel based on a position detection result by the position detection mechanism, wherein the injection and discharge mechanism injects the liquid into the liquid vessel after the position detection by the position detection mechanism.

10. The semiconductor device manufacturing apparatus according to claim 8, further comprising:

a head liquid removal mechanism for removing liquid adhered to the bonding head when the bonding head is pulled up from the liquid in the liquid vessel.

11. The semiconductor device manufacturing apparatus according to claim 8, further comprising:

an ultrasonic cleaning mechanism for propagating ultrasonic vibrations to the liquid in the liquid vessel.

\* \* \* \* \*